United States Patent
Cho et al.

(10) Patent No.: US 9,704,729 B2
(45) Date of Patent: Jul. 11, 2017

(54) SUBSTRATE CLEANING APPARATUS AND METHOD AND BRUSH ASSEMBLY USED THEREIN

(71) Applicant: K.C. TECH CO., LTD., Anseong-si, Gyeonggi-do (KR)

(72) Inventors: Moon Gi Cho, Seoul (KR); Jun Ho Son, Gyeongsan-shi (KR)

(73) Assignee: K.C. TECH CO., LTD., Anseong-si (KR)

( * ) Notice: Subject to any disclaimer, the term of this patent is extended or adjusted under 35 U.S.C. 154(b) by 386 days.

(21) Appl. No.: 14/301,669

(22) Filed: Jun. 11, 2014

(65) Prior Publication Data

US 2014/0366913 A1 Dec. 18, 2014

(30) Foreign Application Priority Data

Jun. 13, 2013 (KR) .................. 10-2013-0067545
Jun. 13, 2013 (KR) .................. 10-2013-0067546

(51) Int. Cl.
*H01L 21/67* (2006.01)
*A46B 13/00* (2006.01)
*B08B 1/04* (2006.01)

(52) U.S. Cl.
CPC ...... *H01L 21/67046* (2013.01); *A46B 13/001* (2013.01); *B08B 1/04* (2013.01)

(58) Field of Classification Search
CPC ... A46B 13/001; B08B 1/04; H01L 21/67046; H01L 21/67028; H01L 21/7092; H01L 21/672426; D21G 1/022; F16C 13/026; F16C 13/028

USPC .............. 15/88.3–88.4, 102; 492/4; 134/902
See application file for complete search history.

(56) References Cited

U.S. PATENT DOCUMENTS

| | | | | |
|---|---|---|---|---|
| 4,425,695 A | * | 1/1984 | Tokuno | F16C 13/00 492/33 |
| 4,455,727 A | * | 6/1984 | Tschirner | F16C 13/028 492/16 |
| 6,467,120 B1 | * | 10/2002 | Ziemins | B08B 1/04 15/102 |
| 2004/0068818 A1 | * | 4/2004 | Wang | H01L 21/67046 15/230.18 |

(Continued)

FOREIGN PATENT DOCUMENTS

| | | | |
|---|---|---|---|
| KR | 10-0639402 | 10/2006 | ........... H01L 21/304 |
| KR | 10-2010-0128412 | 12/2010 | ........... H01L 21/304 |

(Continued)

*Primary Examiner* — Laura C Guidotti
(74) *Attorney, Agent, or Firm* — Kusner & Jaffe

(57) ABSTRACT

Provided are a substrate cleaning apparatus and method and a brush assembly used therein. The substrate cleaning apparatus for contact-cleaning a substrate includes a cleaning brush rotatably disposed in a cylindrical shape and having an outer circumferential surface contacting the substrate to clean the substrate. Here, the cleaning brush includes a plurality of pressure chambers expanding by a fluid pressure and disposed along a longitudinal direction of a rotation axis rotating at a central portion of the cleaning brush, and the plurality of pressure chambers are individually expandable to allow a portion of the outer circumferential surface to protrude in a radial direction and thus contact-clean a portion of the substrate.

20 Claims, 14 Drawing Sheets

(56) References Cited

U.S. PATENT DOCUMENTS

2007/0232203 A1* 10/2007 Fukuda .................... B08B 1/04
451/287

FOREIGN PATENT DOCUMENTS

| KR | 10-1078512 | 10/2011 | ........... H01L 21/304 |
| KR | 10-1080859 | 11/2011 | ........... H01L 21/304 |

* cited by examiner

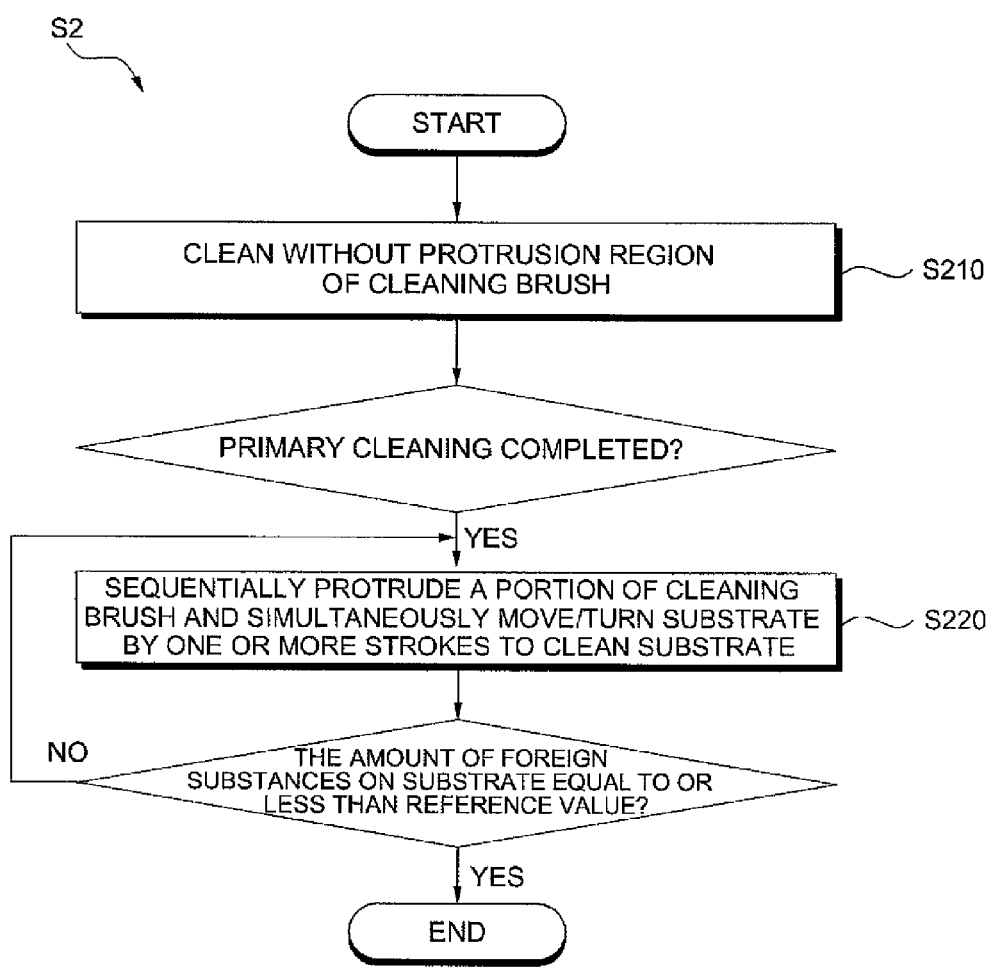

C : C1, C2, C3, C4, C5
150 : 151, 152, 154, 156

SUBSTRATE CLEANING APPARATUS AND METHOD AND BRUSH ASSEMBLY USED THEREIN

CROSS-REFERENCE TO RELATED APPLICATIONS

This U.S. non-provisional patent application claims priority under 35 U.S.C. §119 of Korean Patent Application Nos. 10-2013-0067545 filed on Jun. 13, 2013 and 10-2013-0067546 filed on Jun. 13, 2013, the entire contents of which are hereby incorporated by reference.

BACKGROUND OF THE INVENTION

The present invention disclosed herein relates a substrate cleaning apparatus and method and a brush assembly used therein, and more particularly, to a substrate cleaning apparatus and method and a brush assembly used therein, which can overcome a limitation in that a portion of a substrate is not sufficiently cleaned due to sagging of cleaning brushes when the substrate is cleaned between a pair of cleaning brushes.

Generally, after substrates used for display devices or wafers (hereinafter, referred to as 'substrate) used to manufacture semiconductor devices are treated, a cleaning process is performed to remove foreign substances from the surface of the substrate stained during the treatment process.

FIGS. 1 and 2 show a typical substrate cleaning apparatus 9. In the typical substrate cleaning apparatus 9, when a substrate 66 is transferred between a pair of cleaning brushes by a substrate transfer part, any one of the pair of cleaning brushes 10 moves in a vertical direction 10d, cleaning the surface of the substrate 66 while the cleaning brushes 10 rotate in a state where the substrate 66 is jammed between the cleaning brushes 10.

In this case, the cleaning brushes 10 are rotated by a driving part 40 in different directions, and desalted water or pure water is supplied to any one of the substrate 66 and the cleaning brushes 10 to clean the substrate 66. Although not shown, cleaning liquid (cleaning chemical) and desalted water are supplied to the substrate 66 through a nozzle.

However, in the typical substrate cleaning apparatus 9 configured as above, since a support 20 for rotatably supporting the cleaning brushes 20 is disposed at only one side thereof, sagging may occur due to the self-weight of the cleaning brushes 20, causing a gap E between the cleaning brush 20 and the substrate 66. Accordingly, there is a limitation in that cleaning cannot be uniformly performed because a cleaning frictional force is not uniformly applied to the surface of the substrate 66.

Also, even though the support 20 for rotatably supporting the cleaning brushes 20 is disposed at both ends of the cleaning brushes 20, a gap E may occur when a slight error occurs in the movement distance of the cleaning brush 20 that moves up and down. Even though the surface of the cleaning brush 20 is formed of a flexible material and thus a gap E does not occur in external appearance, there occurs a difference in contact pressurizing force between the cleaning brushes 20 and the substrate 66, causing a nonuniform cleaning frictional force on the surface of the substrate 66 and nonuniform cleaning.

Accordingly, a brush type of cleaning apparatus that can cleanly remove foreign substances from the surface of the substrate 66 is needed.

SUMMARY OF THE INVENTION

The present invention provides a substrate cleaning apparatus and method and a brush assembly used therein, which can cleanly remove foreign substances from the surface of a substrate in spite of an influence by sagging of a cleaning brush when the substrate is cleaned between a pair of cleaning brushes.

Embodiments of the present invention provide substrate cleaning apparatuses for contact-cleaning a substrate, including a cleaning brush rotatably disposed in a cylindrical shape and having an outer circumferential surface contacting the substrate to clean the substrate, wherein the cleaning brush includes a plurality of pressure chambers expanding by a fluid pressure and disposed along a longitudinal direction of a rotation axis rotating at a central portion of the cleaning brush, and the plurality of pressure chambers are individually expandable to allow a portion of the outer circumferential surface to protrude in a radial direction and thus contact-clean a portion of the substrate.

In some embodiments, the substrate cleaning apparatus may further include a foreign substance sensing part for inspecting a distribution of foreign substances remaining on the substrate. Here, based on the distribution of foreign substances inspected by the foreign substance sensing part, the cleaning brush is configured to partially protrude in the radial direction according to a contact location with the substrate.

In other embodiments, the cleaning brush may include two or more regions simultaneously protruding in the radial direction.

In still other embodiments, the fluid pressure may be an air pressure.

In even other embodiments, the foreign substance sensing part may include a vision photographing the substrate to sense the distribution of foreign substance on the substrate from a photographic image by the vision.

In yet other embodiments, the cleaning brush may be disposed in pair to clean the surface of the substrate when the substrate passes between the pair of cleaning brushes.

In further embodiments, the cleaning brush may have both ends supported.

In other embodiments of the present invention, substrate cleaning methods for cleaning a substrate using a cleaning brush that rotates include cleaning the substrate using a cleaning brush rotatably disposed in a cylindrical shape and having an outer circumferential surface contacting the substrate to clean the substrate, wherein the cleaning brush includes a plurality of pressure chambers expanding by a fluid pressure and disposed along a longitudinal direction of a rotation axis rotating at a central portion of the cleaning brush, and the plurality of pressure chambers are individually expandable to allow a portion of the outer circumferential surface to protrude in a radial direction and thus contact-clean a portion of the substrate, removing foreign substances from a surface of the substrate.

In some embodiments, the cleaning of the substrate may include removing foreign substances remaining on the surface of the substrate while protrusion regions of the cleaning brush are sequentially changed.

In other embodiments, the substrate cleaning method may further include inspecting a distribution of foreign substances remaining on the substrate. Here, the cleaning of the substrate is performed by allowing a portion of the cleaning brush protruding according to the distribution of foreign substances acquired in the inspecting of the distribution of foreign substances to contact foreign substances on the substrate.

In still other embodiments, the substrate cleaning method, before the inspecting of the distribution of foreign substances, may include primarily cleaning the substrate without a protrusion region of the cleaning brush that rotates.

In still other embodiments of the present invention, cleaning brush assemblies for a substrate cleaning apparatus include: a cleaning member rotatably disposed in a cylindrical shape and having an outer circumferential surface formed of an elastic material to clean a substrate by contacting the substrate; and a plurality of pressure chambers disposed along a longitudinal direction of a rotation axis rotating at a central portion of the cleaning member and individually expandable to allow a portion of the cleaning member to protrude in a radial direction according to an expansion of the plurality of pressure chambers, wherein the cleaning member protruding in the radial direction due to the individual expansion of a portion of the plurality of pressure chambers contacts a portion of the substrate to clean the substrate.

In some embodiments, the cleaning member may have a recess at a boundary of the plurality of pressure chambers.

In other embodiments, the plurality of pressure chambers may have a hollow cylindrical shape.

In still other embodiments, the cleaning member may be formed of at least one of sponge, cloth, pad, and brush.

In even other embodiments, the pressure chamber may be expanded and contracted by air pressure.

In yet other embodiments, the plurality of pressure chamber may be installed so as to invade a region occupied by an adjacent pressure chamber when expanded.

In further embodiments, the rotation axis may include an extension part extending a region that is not covered by the cleaning member and a fixing member covering an outer circumferential surface of the extension part while having a fine gap with the circumferential surface of the extension part, and a delivery chamber may be formed between the fixing member and the extension part to allow a pneumatic passage to extend from the delivery chamber to the pressure chamber and thus deliver an air pressure to the pressure chamber that rotates, when the air pressure is supplied into the deliver chamber.

In still further embodiments, the delivery chamber may be formed in a ring shape on at least one of the fixing member and the rotation axis.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings:

FIG. 5B is a flowchart illustrating a substrate cleaning method according to another embodiment of the present invention;

DETAILED DESCRIPTION OF PREFERRED EMBODIMENTS

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art.

Hereinafter, it will be described about an exemplary embodiment of the present invention in conjunction with the accompanying drawings.

Figure 1:
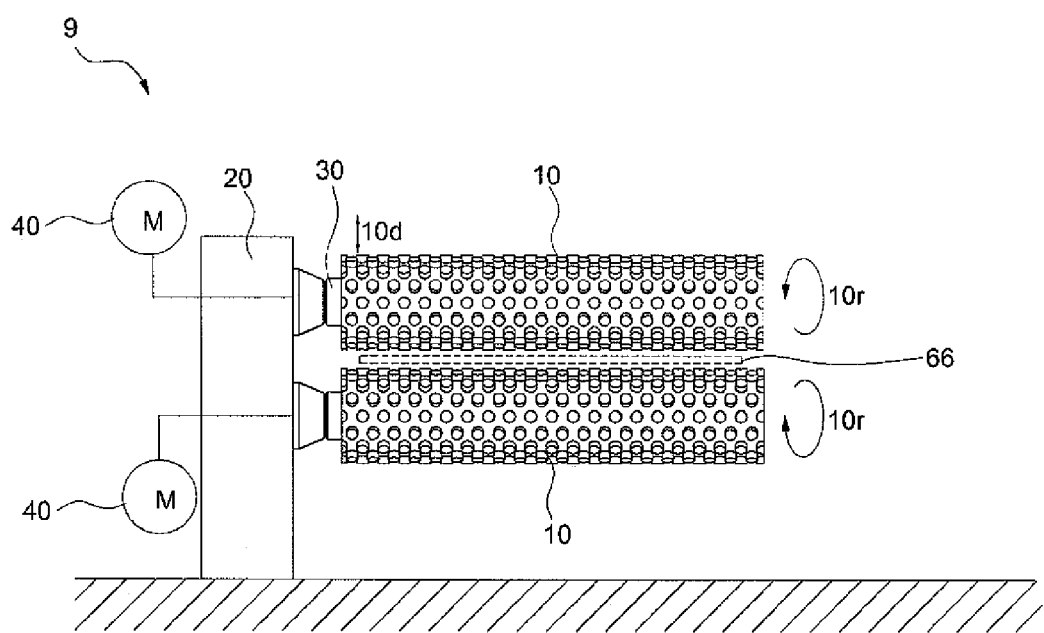
FIG. 1 is a front view illustrating a typical substrate cleaning apparatus.
Figure 2:
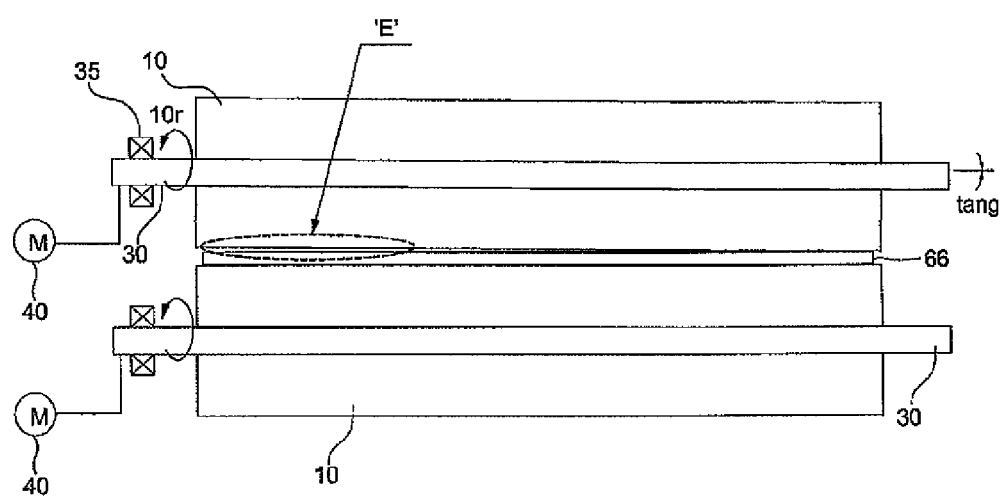
FIG. 2 is a cross-sectional view illustrating cleaning brushes and hollow rotation axes of FIG. 1.
Figure 3:
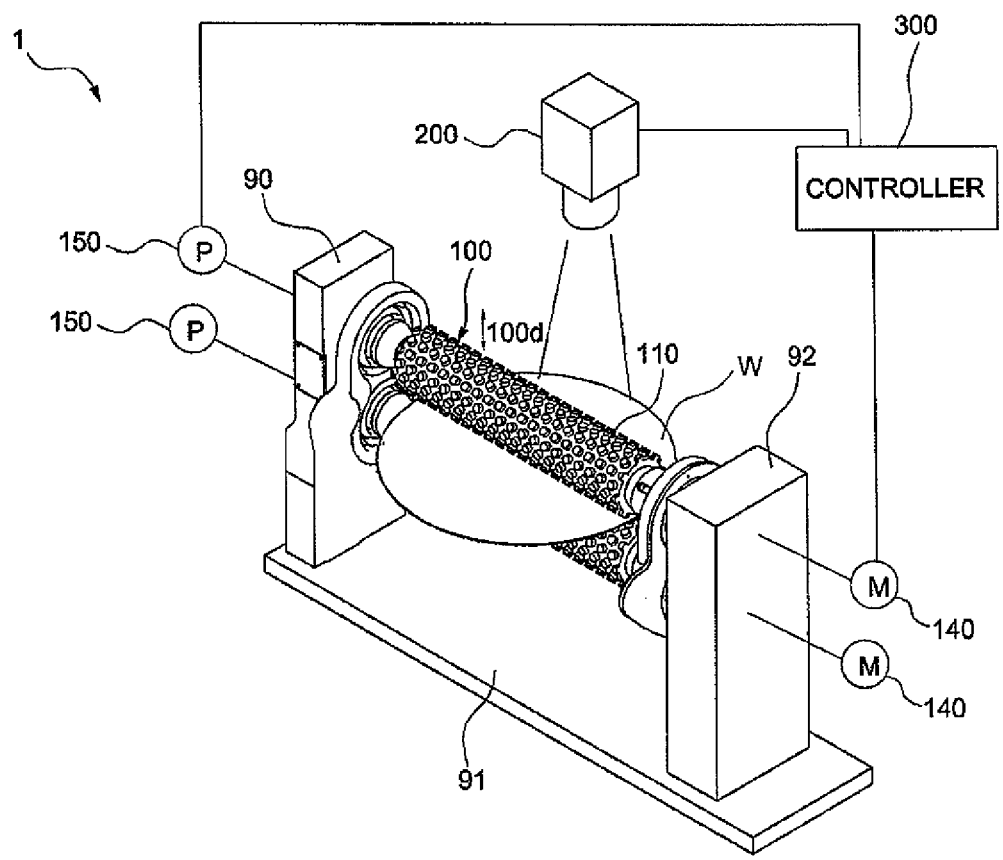
FIG. 3 is a perspective view illustrating a substrate cleaning apparatus according to an embodiment of the present invention.
Figure 4:
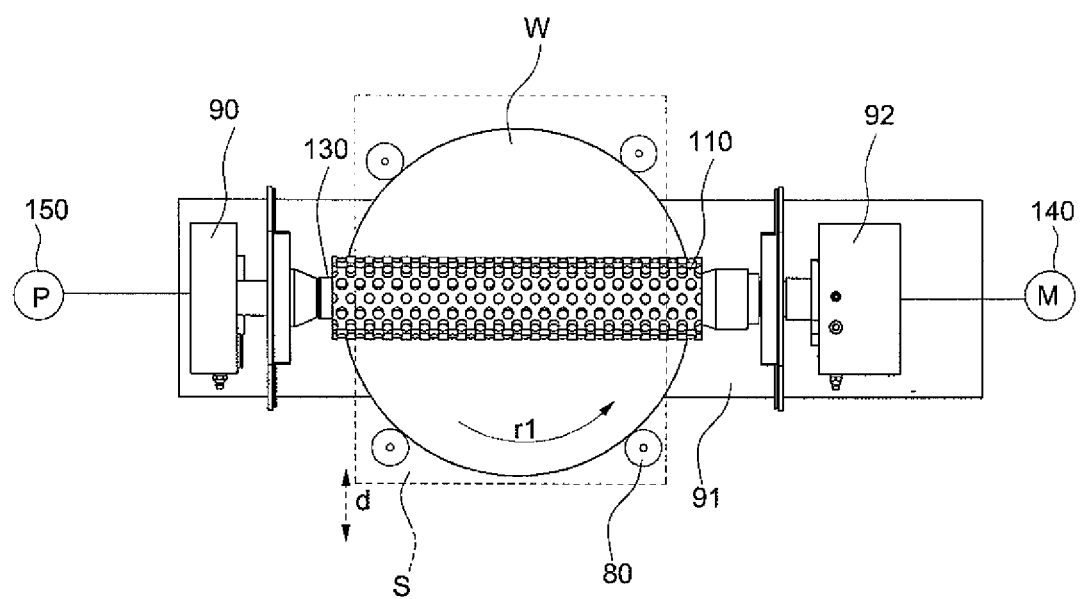
FIG. 4 is a plan view of FIG. 3.
Figure 8:
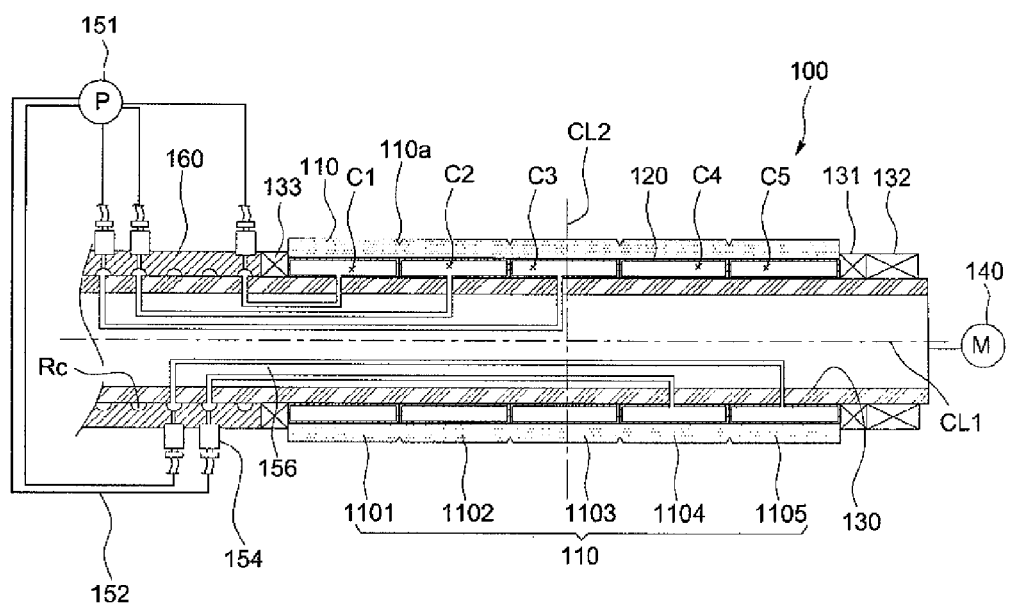
FIG. 8 is a cross-sectional view illustrating a configuration of a cleaning brush assembly of FIG. 3.

As shown in FIGS. 3, 4, and 8, a substrate cleaning apparatus 1 according to an embodiment of the present invention may include a cleaning brush assembly 100 rotatably disposed between a pair of supports 90 and 92, a foreign substance sensing part 200 for inspecting the distribution of foreign substances remaining on the surface of a substrate W, and a controller 300 for controlling the rotation and the protrusion degree of a cleaning brush 110 while moving and turning the substrate W according to the distribution of foreign substances on the substrate W, sensed by the foreign substance sensing part 200.

The brush assembly 100 may include a cleaning brush 110 formed of an elastic resin material and formed to have a thickness of about 2 mm to about 30 mm, a rotation axis 130 rotating the cleaning brush 110, a pressure chambers C formed of an expandable material and arranged in plurality along a longitudinal direction of the rotation axis 130 under the outer surface of the cleaning brush 110, a rotation driving part 140 rotating the rotation axis 130 to rotate the cleaning brush 110, a pneumatic supply 150 applying a positive or negative air pressure to the pressure chamber C to selectively expand or contract the plurality of pressure chambers C, and a fixed body 160 fixed at an end portion of the rotation axis 130 to supply an air pressure to the plurality of pressure chambers C that rotate.

Here, the cleaning brush 110 may be formed of a porous sponge or a resin material that is flexibly deformed by an external force while soaked with water, and may be formed to have a thickness of about 10 mm. That is, the cleaning brush 110 may be formed of one of materials that can perform cleaning by friction. As shown in FIG. 3, the cleaning brush 110 may be disposed in pair, and may allow the substrate W to be disposed therebetween and then rotate to remove foreign substances from the surface of the substrate W.

A recess 110a may be formed along the outer circumferential surface of the cleaning brush 110. The recess 110a may be aligned with the boundary of the pressure chamber C. Thus, when the pressure chamber C expands and thus deforms the cleaning brush 110 so as to protrude in a radial direction, the recess 110a may prevent the protruding of the cleaning brush 110 from being hindered by adjacent regions. However, in one embodiment, when the cleaning brush 110 is formed of a low elastic member, a region where the cleaning brush 110 does not contact the surface of the substrate W may occurs due to the recess 110. Accordingly, the recess 110a may not be formed, or the recess 110a may have a width of about 2 mm or less.

The rotation axis 130 may be disposed to penetrate the central portion of the cleaning brush 110, and may extend out of a region covered with the cleaning brush 110. Thus, the hollow portion of the fixed body 160 may be disposed at the end portion of the rotation axis 130 while having a fine gap from the rotation axis 130, supplying an air pressure into the rotation axis 130. The rotation axis 130 may be rotatably supported by a plurality of bearings 131, 132 and 133.

The pressure chambers C1, C2, C3, C4, and C5; C may be disposed between the rotation axis 130 and the cleaning brush 110, and may have a hollow cylindrical shape. In one embodiment, the pressure chamber C may also be arranged in an arc pattern around the rotation axis 130. When the pressure chamber C expands, the cleaning brush 110 covering the pressure chamber C may protrude in a radial direction as much as the pressure chamber C expands.

Although not shown, a partition (not shown) may be extended and fixed in an outwardly radial direction from the rotation axis 130 between the pressure chambers C1, C2, C3, C4 and C5 arranged in a longitudinal direction of the rotation axis 130, respectively. Thus, the cleaning brush 110 may not protrude toward the boundary surface of the pressure chambers C1, C2, C3, C4 and C5, and may protrude only in an outwardly radial direction. On the other hand, as shown in FIG. 8, the partition fixed between the pressure chambers C1, C2, C3, C4 and C5 arranged in a longitudinal direction of the rotation axis 130 may not be formed. In this case, when one (e.g., C2) of the pressure chambers expands while adjacent chambers C1 and C3 do not expand, the pressure chamber C2 may expand in an outwardly radial direction and invade spaces that adjacent chambers C1 and C3 occupy, also expanding in a longitudinal direction of the rotation axis 130. Accordingly, all parts of the substrate W may contact the cleaning brush 110 to be cleaned.

The rotation driving part 140 may directly rotate the rotation axis 130, and may also rotate the rotation axis 130 via a decelerator.

The fixed body 160 may be provided to supply a positive pressure or a negative pressure from the pneumatic supply 150 located at the outside to the pressure chamber C that rotates. A hollow part may be formed at the central portion of the fixed body 160 to have a fine gap from the outer diameter of the rotation axis 130. The rotation axis 130 may penetrate the hollow part of the fixed body 160. Here, the dimension of the gap may be determined such that the pressure of a connection chamber Rc described later is mostly delivered through a pneumatic passage 156 and the amount of the pressure delivered to adjacent connection chamber Rc through the gap is negligible.

A pneumatic supply hole of a radial direction may be formed in the fixed body 160 at a location where a joint piece 154 from the pneumatic supply 150 is fixed. Also, the connection chamber Rc of a ring shape may be formed between the fixed body 160 and the rotation axis 130. In FIG. 8, although the connection chamber Rc is shown as being configured by forming a ring-shape groove in the inner wall of the fixed body 160, in one embodiment, the ring-shape groove may be formed in the outer circumferential surface of the rotation axis 130, and may be formed in both of the outer circumferential surface of the rotation axis 130 and the inner circumferential surface of the fixed body 160 to form the connection chamber Rc. Thus, the ring-shape connection chamber Rc may be formed to cover the rotation axis 130 in a ring shape, and a passage connected to the connection chamber Rc may be formed in the fixed body 160 and the rotation axis 130 in a radial direction. Accordingly, when an air pressure is supplied to the joint piece that is fixed, the air pressure may be delivered to the pressure chamber C through the pneumatic passage 156 extending from a hole of the rotation axis 130 while being filled in the connection chamber Rc.

In one embodiment, the supply of the air pressure from the outside to the pressure chamber C inside the rotation axis 130 may be implemented using a rotary union.

In other words, the pneumatic supply 150 may include a pneumatic generator 151 including a pump generating a positive or negative air pressure, an external tube 152 extending from the pneumatic generator 151 to supply an air pressure to the fixed body 160, a joint piece 154 disposed at an end of the external tube 152 and fixed to the fixed body 160 to supply an air pressure to the connection chamber Rc located inside the fixed body 160, and a pneumatic passage 156 supplying an air pressure from the hole of the rotation axis 130 communicating with the connection chamber Rc to the pressure chambers C1, C2, C3, C4 and C5; C. Thus, when an air pressure is delivered from the pneumatic generator 151 to the inside of the fixed body 160, the air pressure may be filled in the ring-shape connection chamber Rc formed between the fixed body 160 and the rotation axis 130, allowing the air pressure inside the connection chamber Rc to be delivered to the first to fifth pressure chambers Cl to C5 through the pneumatic passage 156.

Although not shown, the cleaning brush 110, the rotation axis 130 and the pressure chamber C of at least one of the pair of cleaning brush assemblies 100 may be configured to move in a vertical direction 100d by a separate driving unit. Accordingly, when the substrate W is located between the cleaning brushes 110, at least one of the cleaning brush assemblies 100 may approach each other to perform the cleaning process.

The foreign substance sensing part 200 may photograph the surface of the substrate W from a location where the foreign substance sensing part 200 faces the substrate W. Thus, it is possible to check the distribution state of foreign substances remaining on the substrate W using a photographic image. That is, since there is a decided color difference between the substrate W such as a wafer and foreign substances and there is a difference in quantity of light reflected by foreign substances, the photographic image of the surface of the substrate W may be analyzed by pixel to check the distribution state and location of foreign substances on the substrate W.

Based on the distribution of foreign substances on the substrate W, sensed by the foreign substance sensing part 200, the controller 300 may control the protrusion region of the cleaning brush 110 according to the rotation or movement distance of the substrate W to completely remove foreign substances remaining on the substrate W.

The substrate W may be a circular substrate W (solid line of FIG. 4) such as a wafer, which may be contact-cleaned while rotating between the pair of cleaning brushes 110, or may be a rectangular substrate S (dotted line of FIG. 4) such as a glass substrate, which may be contact-cleaned while moving in a straight line between the pair of cleaning brushes 110.

Hereinafter, a substrate cleaning method S1 using the substrate cleaning apparatus 1 according to a first embodiment of the present invention will be described in detail with reference to FIG. 5A.

Step 1: As shown in FIG. 4, a substrate W may be located between a pair of cleaning brushes 110, and one of the brushes 110 may be moved such that both surfaces of the substrate W contact the cleaning brushes 110. As shown in FIG. 4, the substrate W may be rotated in a direction r1 by a substrate rotating part 80 while contacting the cleaning brush 110. Thus, the surface of the substrate W may be primarily cleaned to a certain degree (S 110).

Figure 6A:
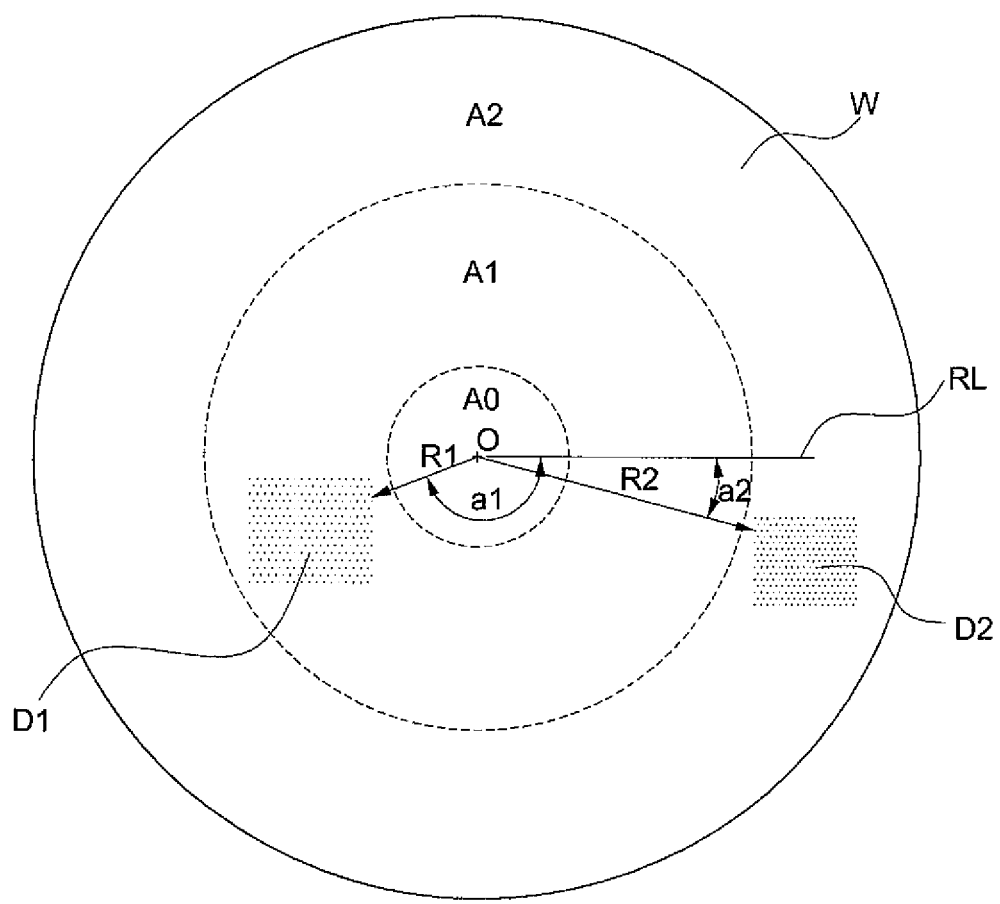
FIGS. 6A through 6E are sequential views illustrating a configuration for a substrate cleaning method according to a first embodiment of the present invention.

Step 2: Thereafter, the surface of the substrate W may be photographed by the foreign substance sensing part 200 to inspect the distribution of foreign substances remaining on the substrate W (S120). In the primary cleaning, since there may occur an inclination of the cleaning brush 110, the whole surface of the substrate W may be insufficiently cleaned due to a nonuniform frictional force. Also, more foreign substances may remain on a region of the substrate W that is cleaned by a relatively low frictional force compared to a region that is cleaned by a relatively higher frictional force. For example, as shown in FIG. 6A, when foreign substances D1 and D2 remain on a first distribution region A1 and a second distribution region A2 of the surface of the substrate W, the foreign substance sensing part 200 may sense where the foreign substances D1 and D2 are located among regions occupied by the five pressure chambers C1, C2, C3, C4 and C5; C. In one embodiment, the number of the pressure chambers may be equal to or less than four, or equal to or more than six.

That is, a zeroth distribution region A0 including the center of the circular substrate W may correspond to a third protrusion region 1103 of the cleaning brush 110 protruded by the third pressure chamber C3, and the first distribution region A1 located outside the zeroth distribution region A0 may correspond to a second protrusion region 1102 and a fourth protrusion region 1104 of the cleaning brush 110 protruded by the second and fourth pressure chambers C2 and C4. Also, the second distribution region A2 located outside the first distribution region A1 may correspond to a first protrusion region 1101 and a fifth protrusion region 1105 of the cleaning brush 110 protruded by the first and fifth pressure chambers C1 and C5.

In this case, angle data including the angles a1 and a2 of the foreign substances D1 and D2 from a rotation reference line RL may be sensed by the foreign substance sensing part 200.

Figure 6B:
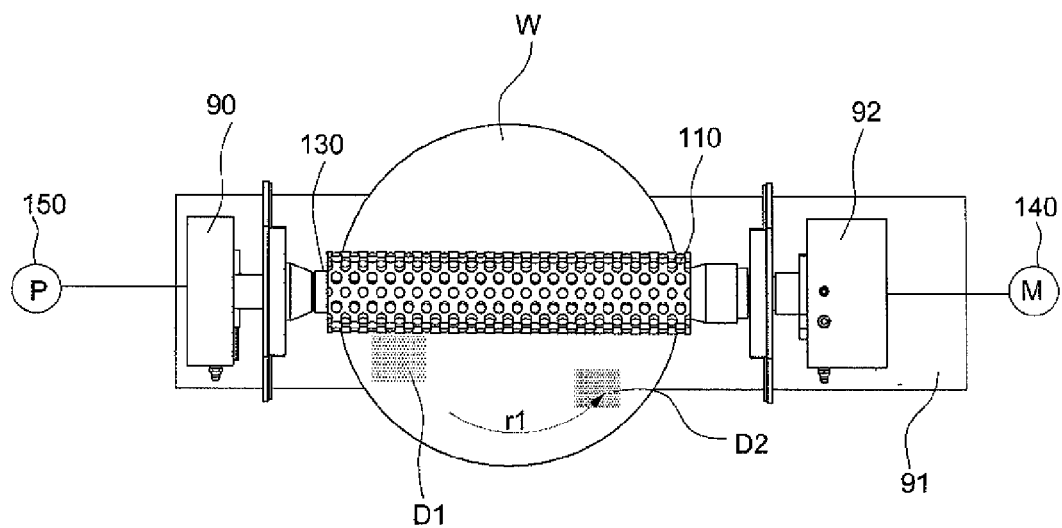
Figure 6C:
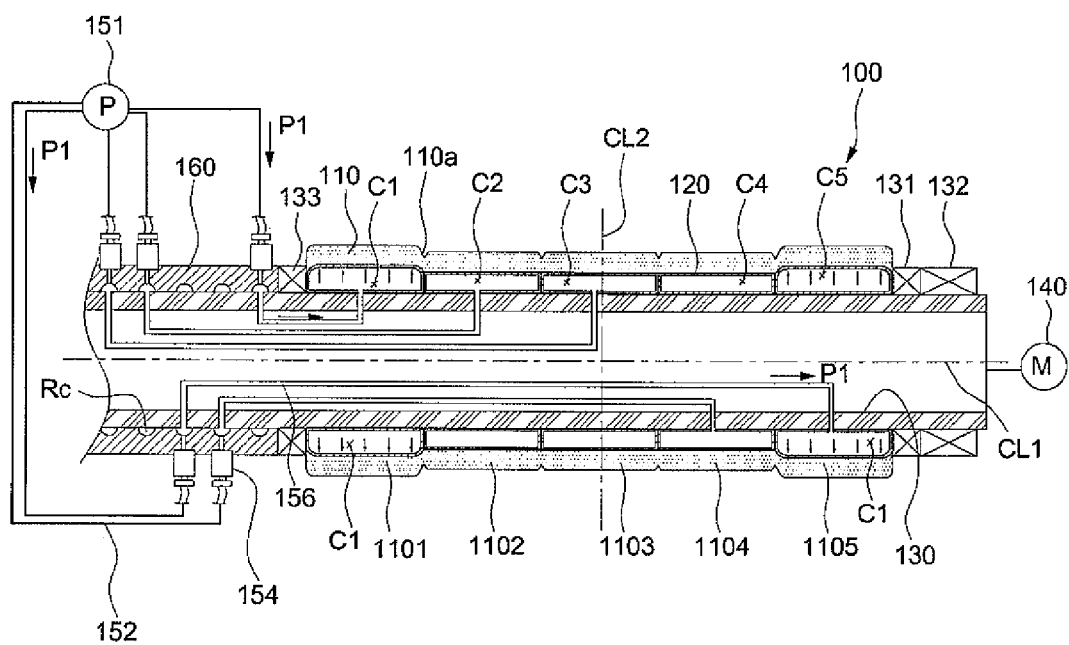
Figure 6D:
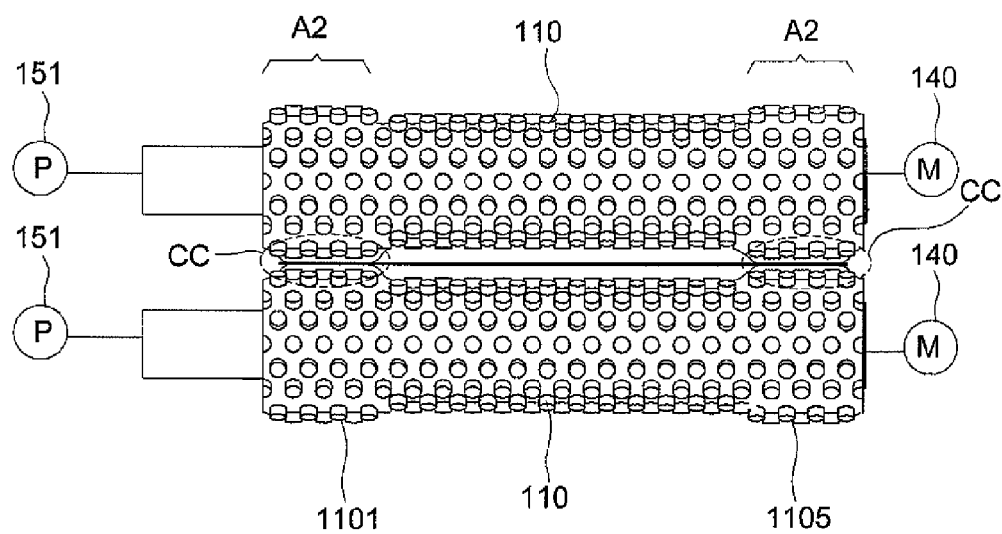

Step 3: Thereafter, as shown in FIG. 6B, the substrate W may be contact-cleaned by the cleaning brush 110 while rotating in the direction r1. As shown in FIG. 6C, a positive air pressure P1 may be supplied from the pneumatic supply 150 through a first pneumatic passage 1561 and a fifth pneumatic passage 1565 to protrude the first protrusion region 1101 and the fifth protrusion region 1105 of the cleaning brush 110 in a radial direction. In this state, the cleaning brush 110 may rotate and the substrate W may rotate in the direction r1. Thus, as shown in FIG. 6, as the surface of the substrate W contacts only the first protrusion region 1101 and the fifth protrusion region 1105, foreign substances remaining on the second distribution region A1 of the substrate W may be cleanly removed. The whole surface of the cleaning brush 110 may not contact the surface of the substrate W, and only the first protrusion region 1101 and the fifth protrusion region 1105, which are a portion of the cleaning brush 110, protrude to contact the surface of the substrate W. Accordingly, foreign substances can be more completely removed from the surface of the substrate W by a larger frictional force.

Figure 6E:
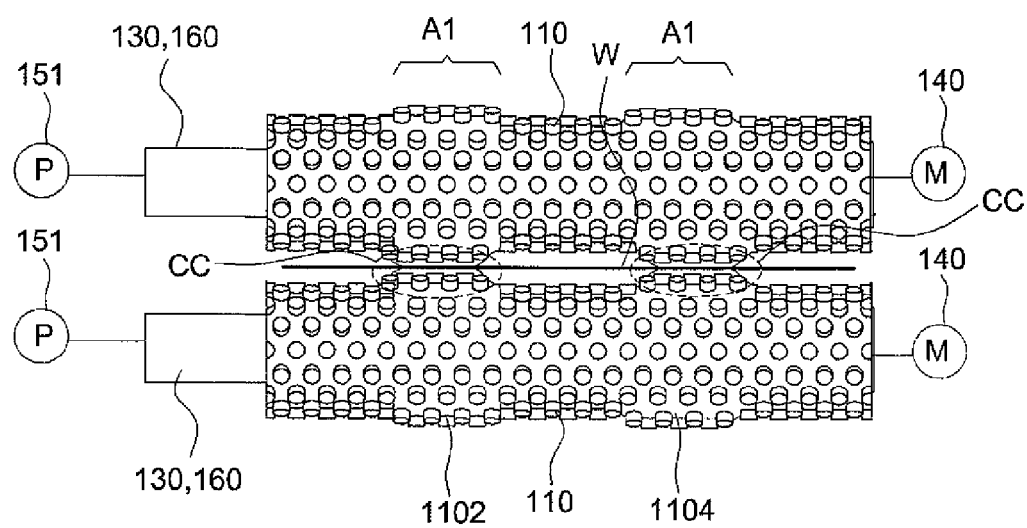

Similarly, in order to remove the foreign substance D1 on the first distribution region A1, as shown in FIG. 6E, only the second protrusion region 1102 and the fourth protrusion region 1104 may protrude. In this state, since the surface of the substrate W contacts only the second protrusion region 1102 and the fourth protrusion region 1104, the foreign substance D1 remaining on the surface of the substrate W can be completely removed.

On the other hand, when the cleaning brush 110 rotates with only a portion thereof protruded and the rotation speed of the substrate W is sufficiently fast compared to the delivery speed of the air pressure into the pressure chamber C, the substrate W may rotate one or more turns in a state where the first and fifth protrusion regions 1101 and 1105 of the cleaning brush 110 protrude, removing the foreign substance D2. Also, the foreign substance D1 may be removed by rotating the substrate W one or more turns in a state where the first and fifth protrusion regions 1101 and 1105 are restored to the original state by a negative pressure or other protrusion regions 1102 and 1104 protrude by a positive pressure while the first and fifth protrusion regions 1101 and 1105 are restored to the original state by a negative pressure.

However, when the cleaning brush 110 rotates with only a portion thereof protruded and the rotation speed of the substrate W is sufficiently slow compared to the delivery speed of the air pressure into the pressure chamber C, the substrate W may rotate such that the foreign substance D2 can be contact-cleaned by the cleaning brush 110 in a state where the first and fifth protrusion regions 1101 and 1105 of the cleaning brush 110 protrude. Thereafter, the first and fifth protrusion regions 1101 and 1105 are immediately restored to the original state by a negative pressure and simultaneously, other protrusion regions 1102 and 1104 protrude by a positive pressure, allowing the foreign substance D1 to be cleaned through the contact with the substrate W. That is, the foreign substances D1 and D2 located at different distribution regions A1 and A2 may be cleaned once a turn of the substrate W. The foreign substances D1 and D2 remaining on the surface of the substrate W may be completely removed by repeating the above-mentioned process.

Thereafter, when foreign substances remaining on the substrate W is determined to be smaller than a reference value by the foreign substance sensing part 200, the substrate cleaning process Si may be finished.

In the drawings, although a circular substrate (e.g., wafer) is exemplified as being cleaned, a rectangular substrate S (dotted line of FIG. 4) may also be cleaned while being moved in a straight-line direction d.

Hereinafter, a substrate cleaning method according to a second embodiment of the present invention will be described with reference to the accompanying drawings.

Figure 5A:
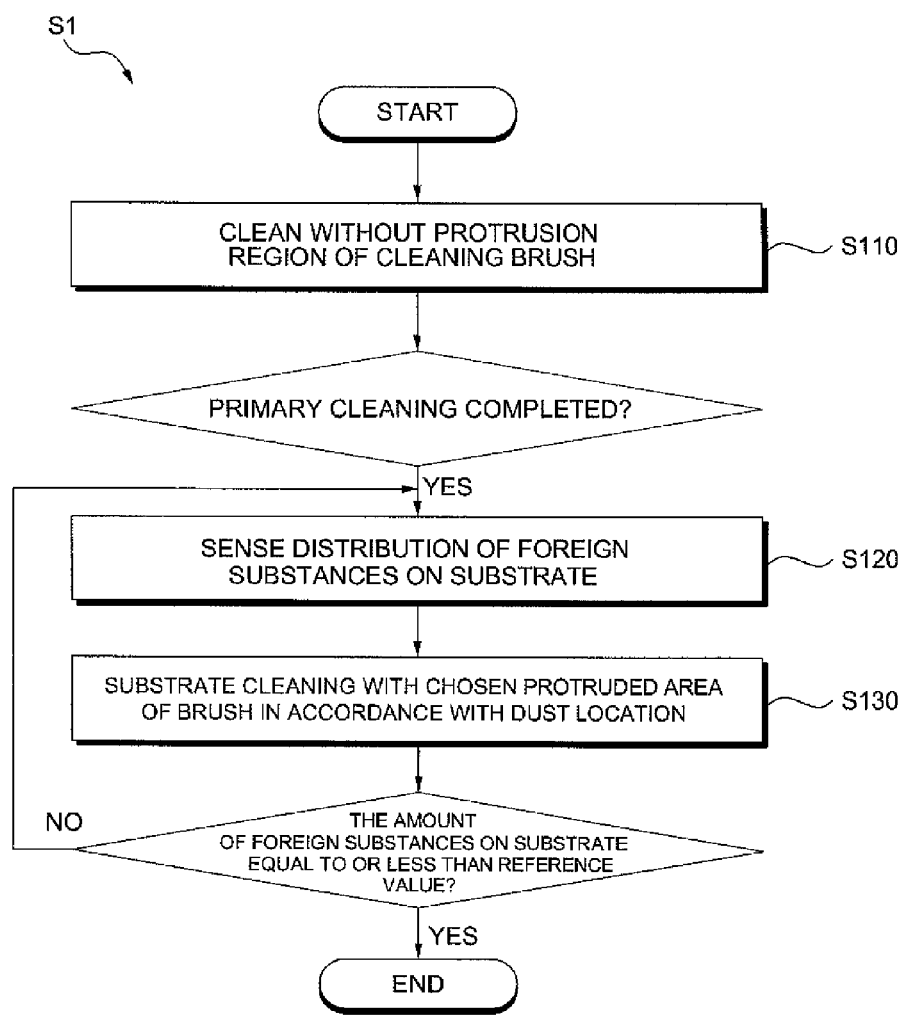
FIG. 5A is a flowchart illustrating a substrate cleaning method according to an embodiment of the present invention.
Figure 7A:
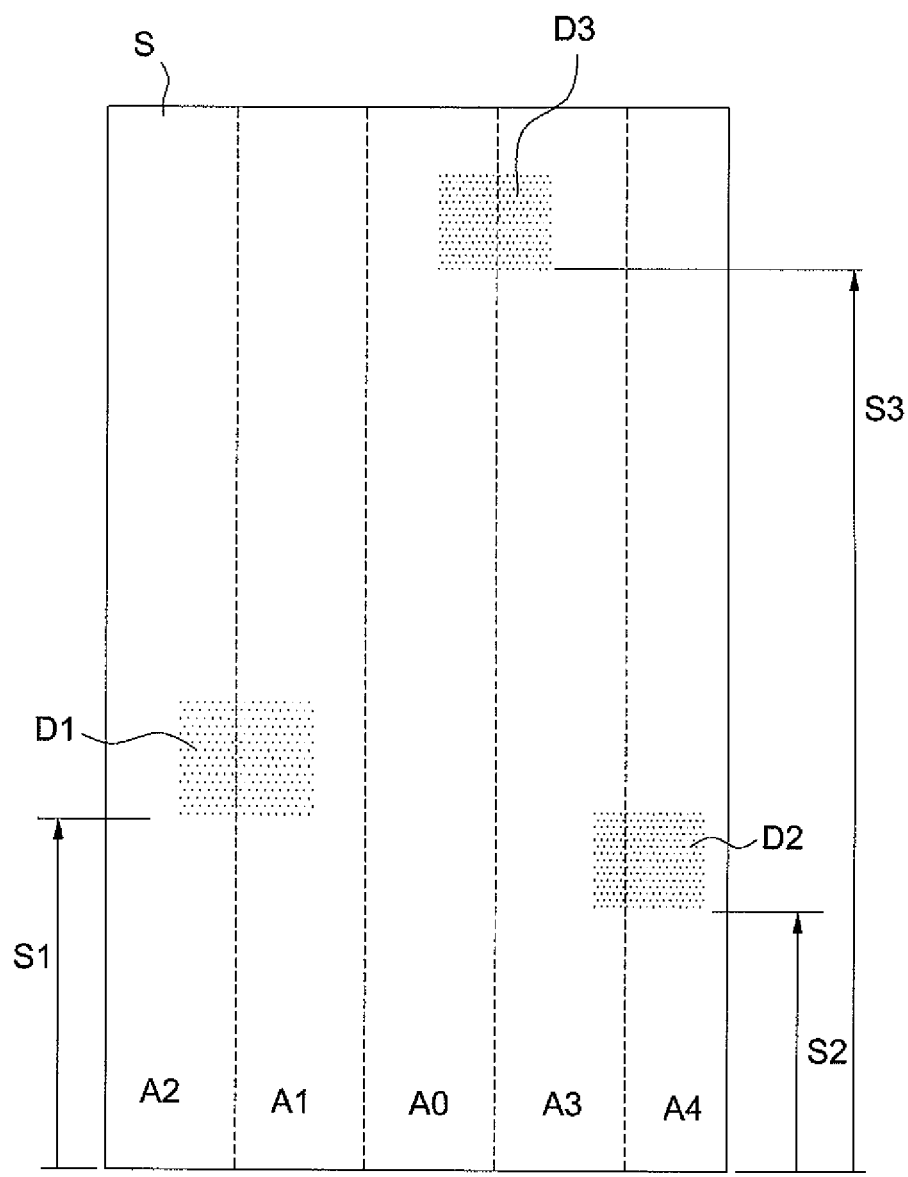
FIGS. 7A and 7B are sequential views illustrating a configuration for a substrate cleaning method according to a second embodiment of the present invention.
Figure 7B:
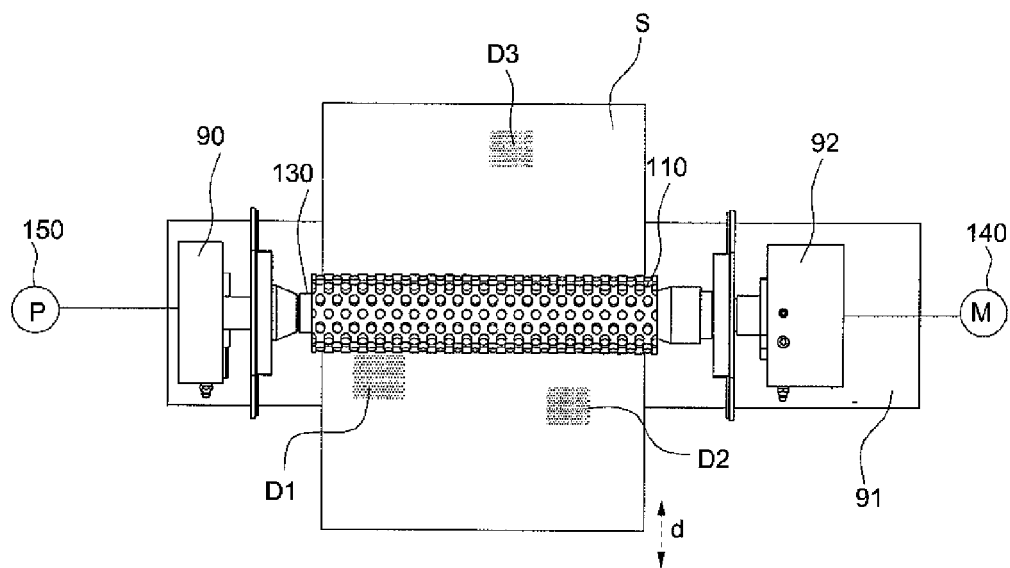

Similarly to the first embodiment, in case of cleaning a rectangular substrate S shown in FIG. 7A, after operation S110 is performed as shown in FIG. 5A, the foreign substance sensing part 200 may inspect the distribution of foreign substances D1, D2 and D3 as shown in FIG. 7A. As shown in FIG. 7B, at least one of protrusion regions 1101 to 1105 of the cleaning brush 110 corresponding to distribution regions A0 to A4 on which the foreign substances are located may protrude while the substrate S is moving. Thus, the foreign substances D1, D2 and D3 remaining on the substrate S can be cleanly removed by a high frictional force of the protrusion regions 1101 to 1105 of the cleaning brush 110.

As shown in FIGS. 6A to 6E, the substrate S may straightly move by distances S1, S2 and S3 at which the foreign substances D1, D2 and D3 on the substrate S nearly contact the cleaning brush 110. When the substrate S moves by the distance S1, the first and second protrusion regions 1101 and 1102 may simultaneously protrude to remove the foreign substance D1 while the substrate S is moving. When the substrate S moves by the distance S2, the fourth and fifth protrusion regions 1104 and 1105 may simultaneously protrude to remove the foreign substance D2 while the substrate S is moving. When the substrate S moves by the distance S3, the third and fourth protrusion regions 1103 and 1104 may simultaneously protrude to remove the foreign substance D3 while the substrate S is moving.

Finally, when the amount of foreign substances remaining on the substrate S sensed by the foreign substance sensing part 200 becomes equal to or less than a reference value, the substrate cleaning process may be finished.

As shown in FIG. 5B, a substrate cleaning method S2 according to a third embodiment of the present invention is similar to the first embodiment in that the cleaning process is performed without a protrusion region of the cleaning brush 110. Without inspecting the distribution of foreign substances D1, D2, . . . , Dn on the substrate W, the protrusion regions 1101 to 1105 of the cleaning brush 110 may alternately move on the surface of the substrate S by one or more strokes (i.e., one turn in circular substrate or distance from one end to the other end in rectangular substrate) to clean the substrate S.

For example, when the first protrusion region 1101 and the third protrusion region 1103 are in the protruded state, the substrate W may be cleaned by one or more strokes. When the second protrusion region 1102 and the fourth protrusion region 1104 are in the protruded state, the substrate W may be cleaned by one or more strokes. When the fifth protrusion region 1105 is in the protruded state, the substrate W may be cleaned by one or more strokes. Thus, the surface of the substrate W can be cleaned.

On the other hand, a substrate cleaning method according to another embodiment of the present invention may directly perform the substrate cleaning processes S120, S130; S220 without the primary cleaning process of the operations S110 and S210 in which cleaning is performed without a protrusion region.

In the substrate cleaning method S1, S2, . . . , Sn according to the embodiments of the present invention, since a portion of the cleaning brush 110 is configured to protrude in a radiation direction to contact and clean the substrates S and W, foreign substances remaining on the substrates can be more completely removed by a higher frictional force of the protrusion region of the cleaning brush 110.

Also, based on the distribution of foreign substances inspected by the foreign substance sensing part, the cleaning brush is configured to partially protrude according to the contact location with the substrate, thereby more completely removing foreign substances in a shorter time during the substrate cleaning process.

Furthermore, after the substrate is primarily cleaned without a protrusion region of the cleaning brush that rotates, the distribution of foreign substances remaining on the substrate may be inspected. Accordingly, since foreign substances remaining on the substrate are cleaned by controlling the protrusion regions of the cleaning brush according to the distribution of foreign substance, foreign substance remaining on the substrate can be completely removed in a shorter time.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A substrate cleaning apparatus for contact-cleaning a substrate, comprising:
    a cleaning brush rotatably disposed in a cylindrical shape and having an outer circumferential surface configured to contact the substrate to clean the substrate;
    a rotation axis configured to rotate the cleaning brush; and
    three or more pressure chambers annularly disposed around the rotation axis along a longitudinal direction of the rotation axis at a central portion of the cleaning brush, the pressure chambers being configured to individually expand upon respective application of fluid pressure thereto such that corresponding portions of the outer circumferential surface of the cleaning brush protrude in a radial direction as much as one or more of the pressure chambers individually expand to contact-clean a portion of the substrate.

2. The substrate cleaning apparatus of claim 1, further comprising a foreign substance sensing part for inspecting a distribution of foreign substances remaining on the substrate,
    wherein, based on the distribution of the foreign substances inspected by the foreign substance sensing part, the cleaning brush is configured to partially protrude in the radial direction according to a contact location with the substrate.

3. The substrate cleaning apparatus of claim 2, wherein two or more regions of the cleaning brush are configured to simultaneously protrude in the radial direction.

4. The substrate cleaning apparatus of claim 2, wherein the fluid pressure is an air pressure.

5. The substrate cleaning apparatus of claim 2, wherein the foreign substance sensing part comprises a vision photographing the substrate to sense the distribution of the foreign substances on the substrate from a photographic image by the vision.

6. The substrate cleaning apparatus of claim 1, wherein the cleaning brush is one of a pair of cleaning brushes, the pair of cleaning brushes being configured to clean the surface of the substrate when the substrate passes between the pair of cleaning brushes.

7. The substrate cleaning apparatus of claim 1, wherein the cleaning brush has both ends supported.

8. The substrate cleaning apparatus of claim 1, wherein the rotation axis is not deformed while the one or more of the pressure chambers expand, and
    wherein two or more of the pressure chambers are configured to expand at the same time.

9. A substrate cleaning method for contact-cleaning a substrate, the method comprising:
    cleaning the substrate using a cleaning brush rotatably disposed in a cylindrical shape and having an outer circumferential surface contacting the substrate to clean the substrate, the cleaning comprising rotating the cleaning brush by a rotation axis; and
    individually expanding at least one of three or more pressure chambers annularly disposed along a longitudinal direction of the rotation axis at a central portion of the cleaning brush, the expanding comprising respectively applying fluid pressure to the at least one of the pressure chambers such that corresponding portions of the outer circumferential surface protrude in a radial direction as much as the at least one of the pressure chambers individually expand to contact-clean a portion of the substrate.

10. The substrate cleaning method of claim 9, wherein the cleaning of the substrate comprises removing foreign substances remaining on a surface of the substrate while the protruding portions of the cleaning brush are sequentially changed.

11. The substrate cleaning method of claim 9, further comprising inspecting a distribution of foreign substances remaining on the substrate,
wherein the protruding portions of the cleaning brush, according to the distribution of foreign substances acquired in the inspecting of the distribution of the foreign substances, contact the foreign substances on the substrate.

12. The substrate cleaning method of claim 11, further comprising, before the inspecting of the distribution of foreign substances and the respective application of the fluid pressure, primarily cleaning the substrate.

13. A cleaning brush assembly for a substrate cleaning apparatus, comprising:
a cleaning member rotatably disposed in a cylindrical shape and having an outer circumferential surface formed of an elastic material, the outer circumferential surface being configured to clean a substrate by contacting the substrate;
a rotation axis rotating at a central portion of the cleaning member; and
three or more pressure chambers annularly disposed around the rotation axis along a longitudinal direction of the rotation axis at a central portion of the cleaning member, the pressure chambers being configured to individually expand upon respective application of fluid pressure thereto such that corresponding portions of the outer circumferential surface of the cleaning member protrude in a radial direction as much as one or more of the pressure chambers individually expand to contact-clean a portion of the substrate.

14. The cleaning brush assembly of claim 13, wherein the cleaning member has a recess at a boundary of the pressure chambers.

15. The cleaning brush assembly of claim 13, wherein the pressure chambers have a hollow cylindrical shape.

16. The cleaning brush assembly of claim 13, wherein the cleaning member is formed of at least one of sponge, cloth, pad and brush.

17. The cleaning brush assembly of claim 13, wherein the pressure chambers are expanded and contracted by air pressure.

18. The cleaning brush assembly of claim 17, wherein each of the pressure chambers is installed so as to invade a region occupied by an adjacent one of the pressure chambers when expanded.

19. The cleaning brush assembly of claim 13, wherein the rotation axis comprises an extension part extending out of a region that is covered by the cleaning member and a fixing member covering an outer circumferential surface of the extension part while having a fine gap with the outer circumferential surface of the extension part, and
wherein a delivery chamber between the fixing member and the extension part is configured to allow a pneumatic passage to extend from the delivery chamber to each of the pressure chambers and thus respectively deliver air pressure to the one or more of the pressure chambers the air pressure is supplied into the delivery chamber.

20. The cleaning brush assembly of claim 19, wherein the delivery chamber is formed in a ring shape on at least one of the fixing member and the rotation axis.

* * * * *